US 6,719,851 B1

(12) United States Patent
Kurita et al.

(10) Patent No.: US 6,719,851 B1
(45) Date of Patent: Apr. 13, 2004

(54) LID ASSEMBLY FOR OPENING A PROCESS CHAMBER LID AND USES THEREFOR

(75) Inventors: Shinichi Kurita, San Jose, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/671,504

(22) Filed: Sep. 26, 2000

(51) Int. Cl.[7] .............................. B08B 9/00; C23C 16/00
(52) U.S. Cl. ........................ 134/8; 134/22.1; 34/242; 49/386; 118/715; 156/345
(58) Field of Search .................... 134/8, 22.1; 34/242; 118/715; 156/345; 49/386

(56) References Cited

U.S. PATENT DOCUMENTS

| | | | | |
|---|---|---|---|---|
| 4,296,153 A | * | 10/1981 | Mahl | 427/444 |
| 6,019,848 A | * | 2/2000 | Frankel et al. | 118/715 |
| 6,110,556 A | * | 8/2000 | Bang et al. | 428/64.1 |

* cited by examiner

*Primary Examiner*—Zeinab EL-Arini
(74) *Attorney, Agent, or Firm*—Adler & Associates

(57) ABSTRACT

Provided herein is a lid assembly for chemical vapor deposition (CVD) process chamber, comprising a moveable lid, two linear guide rollers connected to the lid, one or more linear lifting actuators, and a rotation actuator connected to the axis of the lid. This lid assembly may be used for opening/closing process chamber as well as wet-cleaning process chamber in chemical vapor deposition.

6 Claims, 4 Drawing Sheets

LID ASSEMBLY FOR OPENING A PROCESS CHAMBER LID AND USES THEREFOR

BACKGROUND OF THE INVENTION

1. Field of the Invention

The present invention relates generally to the fields of semiconductor manufacturing. More specifically, the present invention relates to process chamber lid open equipment.

2. Description of the Related Art

During chemical vapor deposition (CVD) processing, reactive gases released inside a process chamber form layers, such as silicon oxides or nitrides, on the surface of a substrate being processed. During this process, oxide/nitride deposition occurs elsewhere in the CVD apparatus. The oxide/nitride residue has a deleterious effect on the CVD process if the CVD apparatus is not periodically cleaned. To avoid these deleterious effects, periodic cleaning procedures are undertaken to remove the oxide/nitride residue every N wafers/substrates, where N is an integer.

The cleaning procedures, however, result in periodic down-time for the CVD system, thereby reducing the system throughput. To reduce the total down-time of the CVD system, two types of cleaning techniques are employed: a gas-clean technique and a wet-clean technique. During a gas-clean technique, a cleaning gas, such as oxygen, $NF_3$, helium and/or nitrogen, is flowed into the process chamber to remove oxide residue present therein. The gas-clean technique is achieved without breaking the vacuum seal of the process chamber, the seal being formed when a lid associated with the process chamber is in a closed position. This technique minimizes the amount of down-time necessary to perform the cleaning procedure. The gas-clean technique is unable to remove a portion of the oxide residue present in the CVD system, necessitating a periodic wet-clean technique. During a wet-clean technique, the vacuum seal of the process chamber is broken by moving the chamber lid to an open position. A user physically wipes down the chamber using chemical cleaners. Thus, the wet-clean technique is substantially more time-consuming than the gas-clean technique, thereby increasing the down-time of the CVD system.

The prior art is deficient in the lack of a CVD system which may reduce the time required for wet-cleaning. Specifically, the prior art is deficient in the lack of integration of lid open equipment at each CVD process chamber, which is capable of moving the process chamber lid up/down (open/close condition) and rotating the lid 180 degrees. The present invention fulfills this long-standing need and desire in the art.

SUMMARY OF THE INVENTION

In one aspect of the present invention, there is provided is a lid assembly for a chemical vapor deposition (CVD) process chamber, comprising a moveable lid, two linear guide rollers, one or more linear lifting actuators, and a rotation actuator. Optionally, the lid assembly may comprise one or more gas springs to support the weight of the lid. The two linear guide rollers are parallel to each other and both are connected to the lid, one on each end of the axis of the lid. The linear lifting actuators move the lid up and down along the linear guide rollers, while the rotation actuator is connected to the axis of the lid and rotates the lid once the lid is lifted to an upper limit. This lid assembly may be used for opening/closing process chamber in chemical vapor deposition (CVD) processes.

In another aspect of the present invention, there is provided is a method of wet-cleaning the process chamber in a chemical vapor deposition procedure. This method comprises the steps of (1) lifting the process chamber lid up by linear lifting actuators; (2) rotating the lid 180 degrees on the axis by a rotation actuator; (3) lowering the lid to below the process chamber, thereby breaking the vacuum seal of the process chamber; and (4) wiping down the chamber using chemical cleaners. During step (1), the lid is moved along linear guide rollers, which are connected to the axis of the lid.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Figure 1:
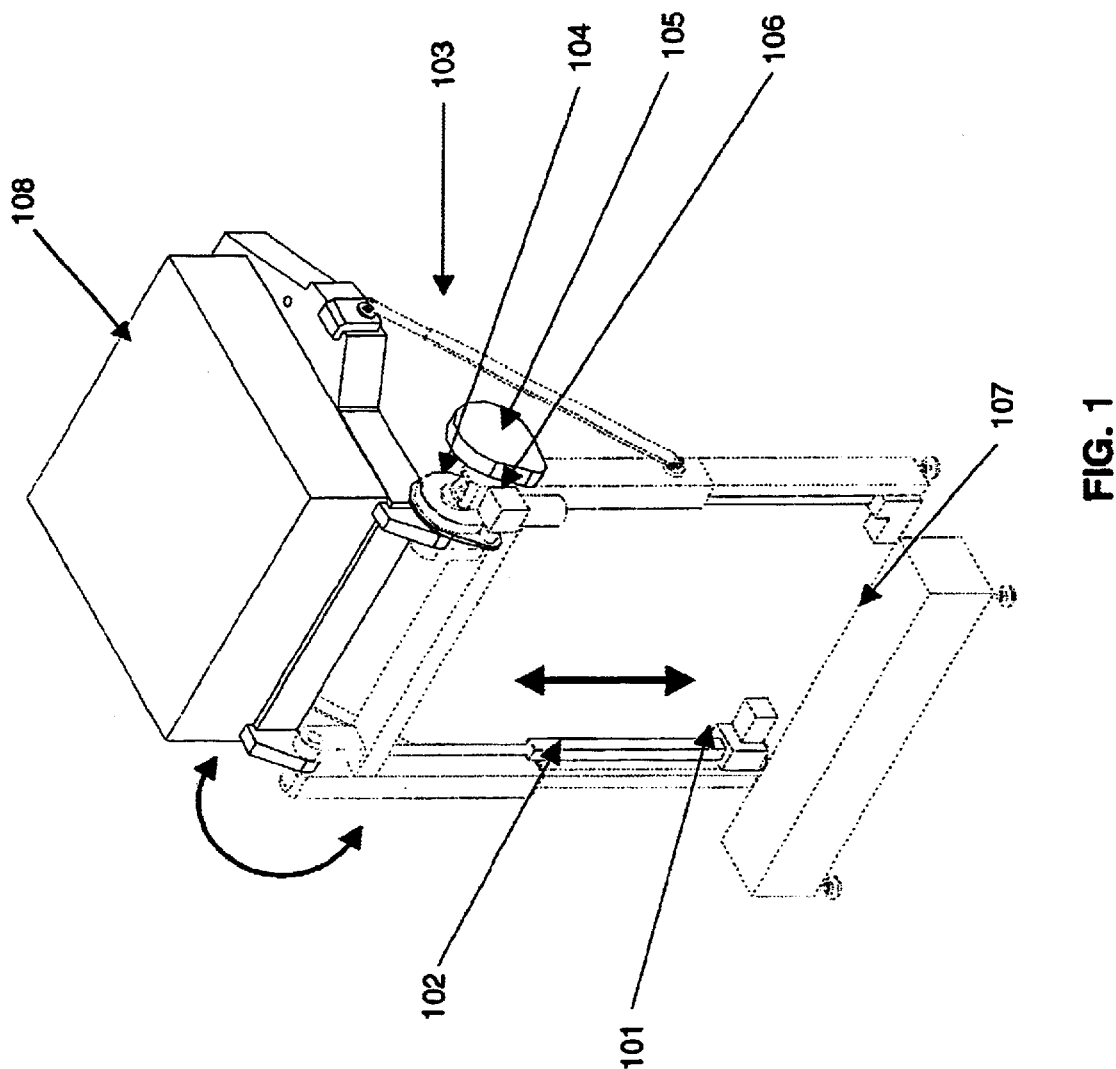
FIG. 1 is an over view of process chamber lid open mechanism showing lifting linear actuator 101, linear guide roller 102, gas spring 103, spur gear reduction 104, gear 105 with a cover (at removed condition), rotation actuator 106, motor controller 107 and a moveable lid 108.
Figure 3:
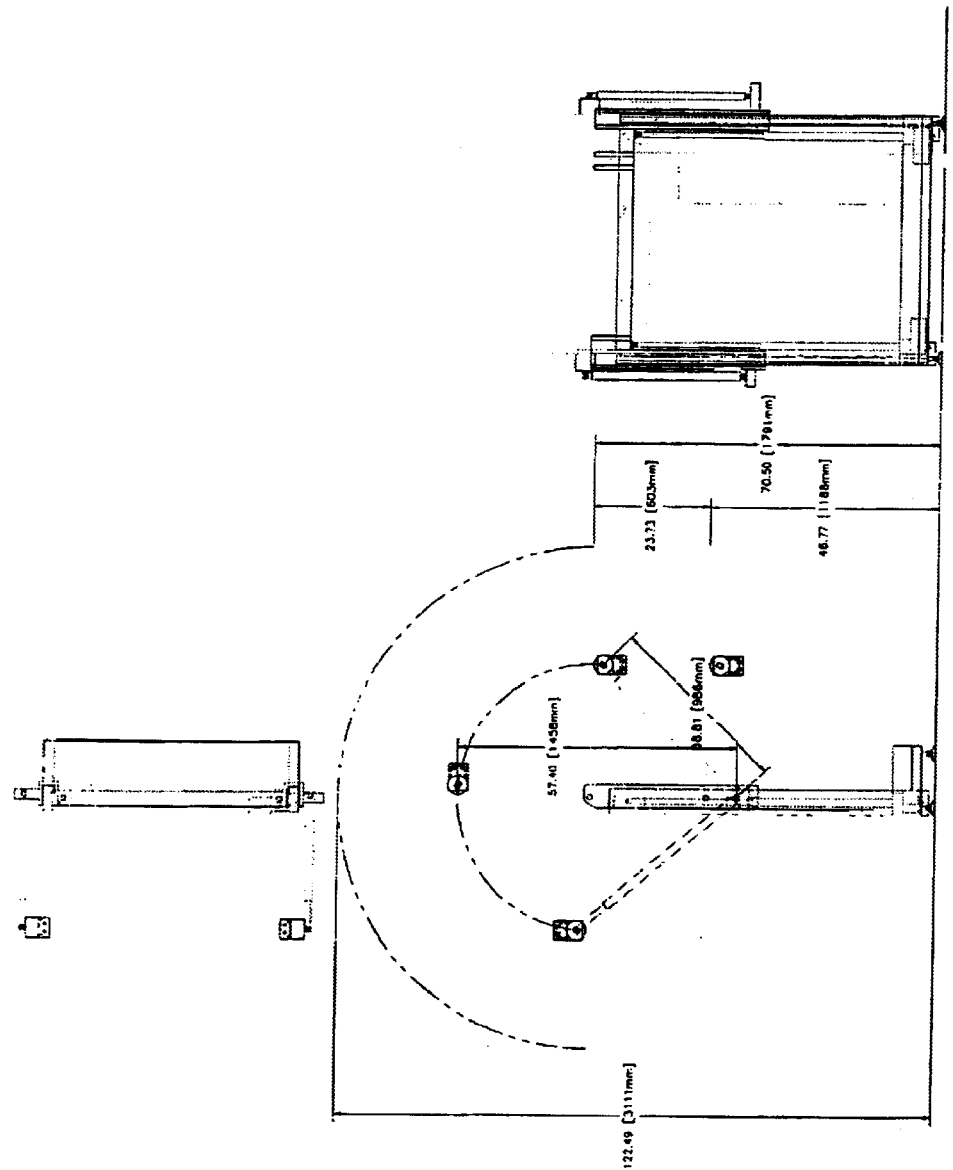
FIG. 3 depicts top, back and side views of the chamber lid working area detailing the dimensions of the lid assembly and the upper and lower distance limits from the shower head surface of the process chamber through which the chamber lid moves after opening, rotating 180°, and lowering. The lid can be lowered from 1.8 m at the upper limit to a lower limit of 1.2 m from the floor level.

Provided herein is a process chamber lid open/close equipment, comprising a moveable lid 108, two lifting linear actuators 101 (one on each end of the axis of the lid), two linear guide rollers 102 (one on each end of the axis of the lid), two gas springs 103, spur gear reduction 104, gear 105, a rotation actuator 106, and a motor controller 107 (FIG. 1). The dimension of the process chamber lid open mechanism is further shown in FIG. 3.

A lid open/close mechanism is constructed with linear guide rollers 102 and linear lifting actuators 101. The lid is supported at the linear guide rollers 102 and operated up or down by lifting linear actuators 101 to a upper (open) or lower (close) limit. Two lifting linear actuators 101 are installed at both ends of the axis of the lid so that the linear actuators do not inhibit to access below process chamber. Process chamber has a controller and related equipment in the middle lower portion. Some indicator and switch are constructed for the control. No equipment is allowed to block/cover the surface of the control panel. Lid weight is supported by two gas springs 103 to reduce the load of rotation actuator 106.

A lid rotation mechanism is constructed with gear 105 and rotation actuator 106 connected to the movable lid 108. The lid rotation mechanism is not operational unless the lid reaches to the upper limit.

Such integration of lid open equipment at each chemical vapor deposition (CVD) process chamber is capable of moving the process chamber lid up/down (open/close condition) and rotating the lid 180 degrees.

Compared with conventional lid open/close and rotation mechanisms, the presently disclosed process chamber lid open mechanism is easy for lid maintenance such as wet cleaning shower head and/or process chamber. The lid can be lowered from 1.8 m to 1.2 m at shower head surface from floor level. Additionally, the present lid open equipment makes it easier to disconnect radiofrequency (RF) power, signal cable and cooling water, since the lid can be lifted straight up.

Figure 2A:
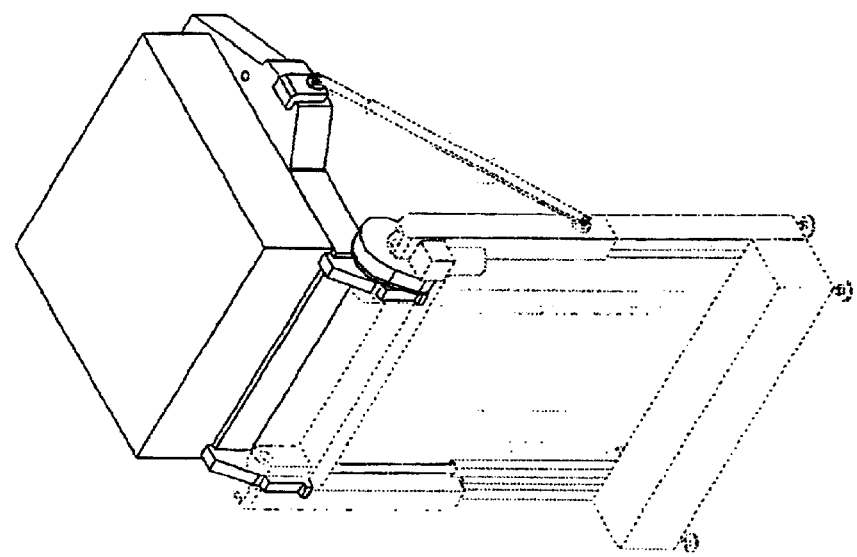
FIGS. 2A–2C show process chamber lid open mechanism operation steps, wherein the lid is first lifted up (FIG. 2A), rotated 180 degrees (FIG. 2B) and then lowered 600 mm (FIG. 2C).
Figure 2B:
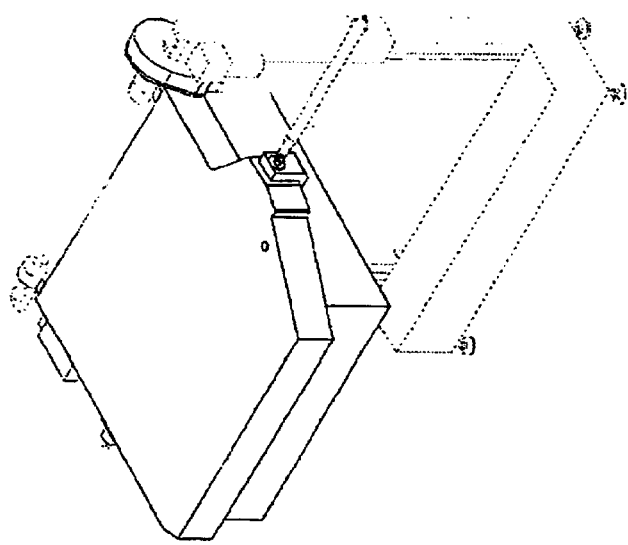
Figure 2C:
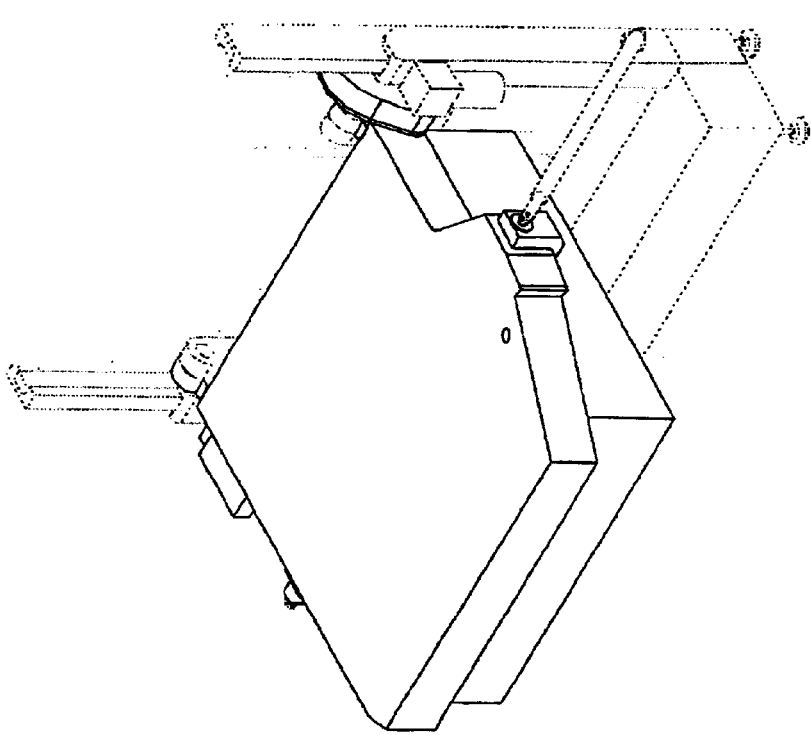

To operate the process chamber lid open equipment disclosed herein, the lid is first lifted up to the upper limit (FIG. 2A), then rotated 180 degrees (FIG. 2B) and last lowered 600 mm (FIG. 2C).

As described above, provided herein is a lid assembly for chemical vapor deposition (CVD) process chamber, comprising a moveable lid, two linear guide rollers, one or more linear lifting actuators, and a rotation actuator. Optionally, the lid assembly may comprise one or more gas springs to support the weight of the lid. The two linear guide rollers are parallel to each other and both are connected to the lid, one on each end of the axis of the lid. The linear lifting actuators move the lid up and down along the linear guide rollers, while the rotation actuator is connected to the axis of the lid and rotates the lid once the lid is lifted to the upper limit. Specifically, the lid can be lowered up to 600 mm by the linear lifting actuators and rotated up to 180 degrees by the rotation actuator.

The presently disclosed lid assembly may be used for opening/closing the process chamber in chemical vapor deposition (CVD) processes. Specifically, the process chamber is in an open condition when the lid is moved up by the linear lifting actuators to a upper limit, whereas the process chamber is in a close condition when the lid is moved down by the linear lifting actuators to a lower limit.

Also provided herein is a method of wet-cleaning a process chamber in chemical vapor deposition. This method comprises the steps of (1) lifting up the process chamber lid by linear lifting actuators; (2) rotating the lid 180 degrees on the axis by a rotation actuator; (3) lowering the lid to below the process chamber, thereby breaking the vacuum seal of the process chamber; and (4) wiping down the chamber using chemical cleaners. During step (1), the lid is moved along linear guide rollers, which are connected to the axis of the lid.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A lid assembly for a process chamber, comprising:
   a moveable lid;
   a first linear guide roller and a second linear guide roller, wherein said first linear guide roller is parallel to said second linear guide roller, and wherein both linear guide rollers are connected to said lid, one linear guide roller on each end of a lateral side of the lid, wherein said lateral side is the axis around which the moveable lid rotates;
   one or more linear lifting actuators to move the lid up and down along said linear guide rollers; and
   a rotation actuator connected to said lateral side of the lid to rotate the lid.

2. The lid assembly of claim 1, further comprising:
   one or more gas springs to support the weight of the moveable lid.

3. The lid assembly of claim 1, wherein said moveable lid can be lowered up to about 600 mm by said linear lifting actuators from an open upper limit of about 1.8 m above a floor surface.

4. The lid assembly of claim 1, wherein said moveable lid can be rotated up to 180 degrees around said axis by said rotation actuator.

5. A method of opening and closing a process chamber in a chemical vapor deposition (CVD) process, comprising the step of:
   applying the lid assembly of claim 1 to the chemical vapor deposition process chamber, wherein the process chamber is in an open condition when the lid is moved up by the linear lifting actuators to an upper limit and wherein the process chamber is in a closed condition when the lid is moved down by the linear lifting actuators to a lower limit.

6. A method of wet-cleaning a process chamber in a chemical vapor deposition procedure, comprising the steps of:
   applying the lid assembly of claim 1 to the chemical vapor deposition process chamber;
   lifting said process chamber lid up by said linear lifting actuators, wherein said lid is moved along linear guide rollers and wherein said linear guide rollers are connected to the lateral axis of the lid;
   rotating said lid 180 degrees around the lateral axis by said rotation actuator;
   lowering the lid to below the process chamber, thereby breaking the vacuum seal of the process chamber; and
   wiping down the chamber using chemical cleaners, whereby the process chamber is cleaned.

* * * * *